(12) United States Patent
Multrus et al.

(10) Patent No.: US 10,242,681 B2
(45) Date of Patent: *Mar. 26, 2019

(54) AUDIO ENCODER AND AUDIO DECODER USING CODING CONTEXTS WITH DIFFERENT FREQUENCY RESOLUTIONS AND TRANSFORM LENGTHS

(71) Applicant: FRAUNHOFER-GESELLSCHAFT ZUR FOERDERUNG DER ANGEWANDTEN FORSCHUNG E.V., Munich (DE)

(72) Inventors: Markus Multrus, Nuremberg (DE); Bernhard Grill, Lauf (DE); Guillaume Fuchs, Nuremberg (DE); Stefan Geyersberger, Wuerzburg (DE); Nikolaus Rettelbach, Nuremberg (DE); Virgilio Bacigalupo, Nuremberg (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/589,881

(22) Filed: Jan. 5, 2015

(65) Prior Publication Data
US 2015/0194160 A1 Jul. 9, 2015

Related U.S. Application Data

(63) Continuation of application No. 13/004,282, filed on Jan. 11, 2011, now Pat. No. 8,930,202, which is a
(Continued)

(51) Int. Cl.
*G10L 19/022* (2013.01)
*G10L 19/025* (2013.01)
(Continued)

(52) U.S. Cl.
CPC ............ *G10L 19/02* (2013.01); *G10L 19/022* (2013.01); *H03M 7/30* (2013.01)

(58) Field of Classification Search
CPC ..... G10L 19/02; G10L 19/022; G10L 19/025; H03M 7/30
(Continued)

(56) References Cited

U.S. PATENT DOCUMENTS 5,852,806 A  12/1998 Johnston et al.
6,226,608 B1  5/2001 Fielder et al.
(Continued)

FOREIGN PATENT DOCUMENTS

EP  1395980 A1  3/2004
EP  3300076  *  3/2018  ............. G10L 19/02
(Continued)

OTHER PUBLICATIONS

Wikipedia, "Bit plane", 5 pages, downloaded Feb. 6, 2017.*
(Continued)

*Primary Examiner* — Martin Lerner
(74) *Attorney, Agent, or Firm* — Perkins Coie LLP

(57) ABSTRACT

An audio encoder for encoding segments of coefficients, the segments of coefficients representing different time or frequency resolutions of a sampled audio signal, the audio encoder including a processor for deriving a coding context for a currently encoded coefficient of a current segment based on a previously encoded coefficient of a previous segment, the previously encoded coefficient representing a different time or frequency resolution than the currently encoded coefficient. The audio encoder further includes an entropy encoder for entropy encoding the current coefficient based on the coding context to obtain an encoded audio stream.

2 Claims, 11 Drawing Sheets

Related U.S. Application Data continuation of application No. PCT/EP2009/003521, filed on May 18, 2009.

(60) Provisional application No. 61/103,820, filed on Oct. 8, 2008, provisional application No. 61/079,842, filed on Jul. 11, 2008.

(51) Int. Cl.
*H03M 7/30* (2006.01)
*G10L 19/02* (2013.01)

(58) Field of Classification Search
USPC ....... 704/203, 205, 219, 229, 230, 500, 501; 341/51, 61
See application file for complete search history.

(56) References Cited

U.S. PATENT DOCUMENTS

| | | | |
|---|---|---|---|
| 6,931,291 B1 | 8/2005 | Alvarez-Tinoco et al. | |
| 7,275,031 B2 | 9/2007 | Hoerich et al. | |
| 7,275,936 B1 | 10/2007 | Ju | |
| 7,433,824 B2* | 10/2008 | Mehrotra | G10L 19/0017 704/503 |
| 7,509,161 B2* | 3/2009 | Viertio-Oja | A61B 5/048 600/544 |
| 7,617,110 B2 | 11/2009 | Kim et al. | |
| 7,729,903 B2 | 6/2010 | Schuller et al. | |
| 8,095,359 B2 | 1/2012 | Boehm et al. | |
| 8,447,620 B2 | 5/2013 | Neuendorf et al. | |
| 8,494,865 B2 | 7/2013 | Fuchs et al. | |
| 8,612,240 B2 | 12/2013 | Fuchs et al. | |
| 8,645,145 B2 | 2/2014 | Subbaraman et al. | |
| 8,655,669 B2 | 2/2014 | Fuchs et al. | |
| 8,682,681 B2 | 3/2014 | Fuchs et al. | |
| 8,706,510 B2 | 4/2014 | Fuchs et al. | |
| 8,930,202 B2* | 1/2015 | Multrus | G10L 19/022 704/501 |
| 9,455,739 B2* | 9/2016 | Tanida | H03M 7/30 |
| 9,633,664 B2* | 4/2017 | Subbaraman | G10L 19/0017 |
| 9,978,380 B2* | 5/2018 | Fuchs | G10L 19/0017 |
| 10,115,401 B2* | 10/2018 | Fuchs | G10L 19/0017 |
| 2003/0115041 A1 | 6/2003 | Chen et al. | |
| 2004/0002854 A1 | 1/2004 | Ha | |
| 2004/0136459 A1 | 7/2004 | Yavits et al. | |
| 2005/0015249 A1* | 1/2005 | Mehrotra | G10L 19/0017 704/230 |
| 2005/0203731 A1* | 9/2005 | Oh | G10L 19/0017 704/203 |
| 2006/0136229 A1* | 6/2006 | Kjoerling | G10L 19/008 704/501 |
| 2007/0016427 A1* | 1/2007 | Thumpudi | G10L 19/035 704/500 |
| 2007/0036223 A1* | 2/2007 | Srinivasan | H03M 7/46 375/240.18 |
| 2007/0185706 A1 | 8/2007 | Chen et al. | |
| 2008/0094259 A1* | 4/2008 | Yu | G10L 19/0017 341/51 |
| 2009/0240491 A1* | 9/2009 | Reznik | G10L 19/24 704/219 |
| 2010/0080284 A1* | 4/2010 | Lee | H04N 19/176 375/240.02 |
| 2010/0118971 A1* | 5/2010 | Tanida | H03M 7/30 375/240.23 |
| 2011/0173007 A1 | 7/2011 | Multrus et al. | |
| 2011/0238426 A1* | 9/2011 | Fuchs | G10L 19/0017 704/500 |

FOREIGN PATENT DOCUMENTS

| | | |
|---|---|---|
| GB | 2305089 A | 3/1997 |
| JP | 2005242363 A | 9/2005 |
| KR | 10-2005-0087956 A | 9/2005 |
| RU | 2289858 C2 | 12/2006 |
| TW | I246256 B | 12/2005 |
| TW | 200644448 | 12/2006 |
| TW | 200707275 | 2/2007 |
| TW | 200746044 A1 | 12/2007 |
| WO | 00/60759 A1 | 10/2000 |
| WO | 2002091363 A1 | 11/2002 |
| WO | 2005078704 A1 | 8/2005 |
| WO | 2007/096808 A1 | 8/2007 |

OTHER PUBLICATIONS

Malvar, H.S., "Biorthogonal and Nonuniform Lapped Transforms for Transform Coding with Reduced Blocking and Ringing Artifacts", IEEE Transactions on Signal Processing, IEEE Service Center, XP11058114A, vol. 46, No. 4, Apr. 1998, pp. 1043-1053.

Marpe, D. et al., "Context-Based Adaptive Binary Arithmetic Coding in the H.264/AVC Video Compression Standard", IEEE Transactions on Circuits and Systems for Video Technology, XP11099255A, vol. 13, No. 7, Jul. 2003, pp. 620-636.

Meine, N. et al., "Improved Quantization and Lossless Coding for Subband Audio Coding", Audio Engineering Society Convention Paper 6468, AES 118th Convention, XP008071322, May 28-31, 2005, pp. 1-9.

Yokotani, Y. et al., "Lossless Audio Compression Using Integer Modified Discrete Cosine Transform", Proceedings of ISPACS, XP007909333, Dec. 7-10, 2003, pp. 120-126.

Yu, et al., "MPEG-4 Scalable to Lossless Audio Coding", Audio Engineering Society Convention Paper 6183, AES 117th Convention, XP40372512A, Oct. 28-31, 2004, pp. 1-14.

\* cited by examiner (STATE OF THE ART)

AUDIO ENCODER AND AUDIO DECODER USING CODING CONTEXTS WITH DIFFERENT FREQUENCY RESOLUTIONS AND TRANSFORM LENGTHS

CROSS-REFERENCE TO RELATED APPLICATIONS

This application is a continuation of U.S. patent application Ser. No. 13/004,282, filed Jan. 11, 2011, now U.S. Pat. No. 8,930,202 issued 06 Jan. 2015, which is a continuation of International Application No. PCT/EP2009/003521, filed May 18, 2009, and additionally claims priority from U.S. Applications Nos. 61/079,842, filed Jul. 11, 2008, and 61/103,820, filed Oct. 8, 2008, each of which are incorporated herein by reference in their entirety.

BACKGROUND OF THE INVENTION

The present invention is in the field of audio coding, especially in the field of context based entropy coding.

Traditional audio coding concepts include an entropy coding scheme for redundancy reduction. Typically, entropy coding is applied to quantized spectral coefficients for frequency domain based coding schemes or quantized time domain samples for time domain based coding schemes. These entropy coding schemes typically make use of transmitting a codeword in combination with an according codebook index, which enables a decoder to look up a certain codebook page for decoding an encoded information word corresponding to the transmitted codeword on the said page. In some coding concepts, transmission of the codebook index may nevertheless not be mandatory, for example, for cases in which the codebook index can be determined from the context of a symbol, which is, for example, entropy coded as described in Meine, Edler, "Improved Quantization and Lossless Coding for Subband Audio Coding" and Meine, "Vektorquantisierung and kontextabhängige arithmetische Codierung für MPEG-4 AAC", Dissertation, Gottfried Wilhelm Leibnitz Universität Hannover, Hanover 2007.

For frequency or spectral domain based audio coding, a context may describe symbols or statistical properties, as for example, quantized spectral coefficients, which are prior in time and/or frequency. In some of the conventional concepts, these symbols may be available at both, the encoder and the decoder side, and based on these symbols, a codebook or context can be determined synchronously at both encoder and decoder sides.

FIG. 9 shall illustrate an example of a context and its dependencies. FIG. 9 shows a time frequency plane, in which a number of symbols are indicated. Symbol $S_{n,m}$ denotes a symbol at time n and frequency m. FIG. 9 illustrates that for encoding a certain symbol, its context is used to determine the associated codebook. For example, for a symbol $S_{n0,m0}$ this would be all symbols with n<n0 and any m, or with n=n0 and m<m0.

In practical implementations, a context is not infinite, but limited. In the example depicted in FIG. 9, the context for symbol $S_{0,3}$ could, for example, be $S_{0,2}$, $S_{0,1}$, $S_{-1,5}$, $S_{-1,4}$, $S_{-1,3}$, $S_{-1,2}$, $S_{-1,1}$, $S_{-2,5}$, $S_{-2,4}$, $S_{-2,3}$, $S_{-2,2}$, $S_{-2,1}$.

For frequency based audio coding, time variant, signal adaptive filter banks or so-called block transformations may be used, as for example, described in Edler, B., "Codierung von Audiosignalen mit überlappender Transformation and adaptiven Fensterfunktionen", Frequenz, Ausgabe 43, September 1989.

In other words, frequency/time resolution changes may occur over time within these audio coding concepts. A popular audio coding concept is the so-called AAC (AAC=Advanced Audio Coding), in case of which two block lengths are used, for which are coded for example either 128 or 1024 transformed coefficients representing the frequency components of 256 or 2048 windowed time domain samples respectively.

These concepts allow the switching between the different resolutions, depending on certain signal characteristics, as for example occurrence of transients or tonality or whether the signal is music-like or speech-like, etc. In case of switching between different time/frequency resolutions, as for example, between different AAC block types, the context is not consistent. Conventional concepts or state-of-the-art implementations may utilize resetting of the context, i.e., it is basically switched to a state, in which no context is available, in which a context is built up from scratch. This approach may work out sufficiently well, for example in AAC, since it guarantees at least two long blocks or eight short blocks in a row, where it can be assumed that switching occurs only seldom.

However, conventional concepts resetting the context are in general sub-optimal in terms of coding efficiency, since each time the context is reset, the subsequent codebook selection is based on values, which are designed as fall-back solutions for unknown context. Generally, sub-optimal codebooks are then selected. The drawback in coding efficiency may be negligible for cases in which the switching occurs only seldom. For a scenario, however, with more frequent switching, this leads to a significant loss in coding efficiency. On the one hand, a more frequent switching is strongly desired for lower data rates/sampling rates, since especially here, an optimum adaptation of the transform length to the signal characteristic is desired. On the other hand, coding efficiency decreases significantly when switching frequently.

SUMMARY

According to an embodiment, an audio encoder for encoding a sequence of segments of coefficients, the segments being subsequent to each other in time, may have: a means for providing the sequence of segments of coefficients from an audio stream representing a sampled audio signal by using different transform lengths such that segments of coefficients for which different transform lengths are used, spectrally represent the sampled audio signal at different frequency resolutions; a processor for deriving a coding context for a currently encoded coefficient of a current segment based on a previously encoded coefficient of a previous segment, the previous and current segments corresponding to different frequency resolutions and different transform lengths, respectively; and an entropy encoder for entropy encoding the current coefficient based on the coding context to obtain an encoded audio stream.

According to another embodiment, a method for encoding a sequence of segments of coefficients, the segments being subsequent to each other in time, may have the steps of: providing the sequence of segments of coefficients from an audio stream representing a sampled audio signal by using different transform lengths such that segments of coefficients for which different transform lengths are used, spectrally represent the sampled audio signal at different frequency resolutions; deriving a coding context for a currently encoded coefficient of a current segment based on a previously encoded coefficient of a previous segment, the previous and current segments corresponding to different frequency resolutions and different transform lengths, respectively; and entropy encoding the current coefficient based on the coding context to obtain an encoded audio stream.

According to another embodiment, an audio encoder for encoding segments of coefficients, the segments of coefficients representing different time or frequency resolutions of a sampled audio signal, may have: a means for providing the segments of coefficients from an audio stream, the coefficients forming a spectral representation of an audio signal represented by the audio stream at a spectral resolution varying among the segments; a processor for deriving a coding context for a currently encoded coefficient of a current segment based on a previously encoded coefficient of a previous segment, the previously encoded coefficient representing a different time or frequency resolution than the currently encoded coefficient; and an entropy encoder for entropy encoding the current coefficient based on the coding context to obtain an encoded audio stream, wherein the entropy encoder is adapted for encoding the current coefficient in units of a tuple of spectral coefficients and for predicting a range of the tuple based on the coding context, wherein the entropy encoder is adapted for dividing the tuple by a predetermined factor as often as necessitated to fit a result of the division in a predetermined range and for encoding a number of divisions necessitated, a division remainder and the result of the division when the tuple does not lie in the predicted range, and for encoding a division remainder and the result of the division otherwise, and wherein the entropy encoder is adapted for encoding the result of the division or the tuple using a group index, the group index referring to a group of one or more codewords for which a probability distribution is based on the coding context, and, based on a uniform probability distribution, an element index in case the group comprises more than one codeword, the element index referring to a codeword within the group, and for encoding the number of divisions by a number of escape symbols, an escape symbol being a specific group index only used for indicating a division, and for encoding the remainders of the divisions based on a uniform probability distribution using an arithmetic coding rule.

According to another embodiment, an audio decoder for decoding an encoded audio stream representing a sampled audio signal to obtain a sequence of segments of coefficients being subsequent to each other in time and representing the sampled audio signal by using different transform lengths such that segments of coefficients for which different transform lengths are used, spectrally represent the sampled audio signal at different frequency resolutions, may have: a processor for deriving a coding context for a currently decoded coefficient of a current segment based on a previously decoded coefficient of a previous segment, the previous and current segments corresponding to different frequency resolutions and different transform lengths, respectively; and an entropy decoder for entropy decoding the current coefficient based on the coding context and the encoded audio stream.

According to another embodiment, an audio decoder for decoding an encoded audio stream to obtain segments of coefficients representing different time or frequency resolutions of a sampled audio signal, may have: a processor for deriving a coding context for a currently decoded coefficient of a current segment based on a previously decoded coefficient of a previous segment, the previously decoded coefficient representing a different time or frequency resolution than the currently decoded coefficient; and an entropy decoder for entropy decoding the current coefficient based on the coding context and the encoded audio stream, wherein the processor is adapted for deriving the coding context based on the previous coefficient, the coefficients forming a spectral representation of an audio signal represented by the audio stream at a spectral resolution varying among the segments, wherein the processor is adapted for deriving the coding context for the current coefficient, based on neighbouring spectral coefficients previously decoded in the previous segment and optionally in the present segment, and wherein the entropy decoder is adapted for decoding a group index from the encoded audio stream based on a probability distribution derived from the coding context, wherein the group index represents a group of one or more codewords, and for, based on a uniform probability distribution, decoding an element index from the encoded audio stream if the group index indicates a group comprising more than one codeword, and for deriving a tuple of spectral coefficients of the current segment based on the group index and the element index, thereby obtaining the spectral domain representation in tuples of spectral coefficients.

According to another embodiment, a method for decoding an encoded audio stream representing a sampled audio signal to obtain a sequence of segments of coefficients being subsequent to each other in time and representing the sampled audio signal by using different transform lengths such that segments of coefficients for which different transform lengths are used, spectrally represent the sampled audio signal at different frequency resolutions, may have the steps of: deriving a coding context for a currently decoded coefficient of a current segment based on a previously decoded coefficient of a previous segment, the previous and current segments corresponding to different frequency resolutions and different transform lengths, respectively; and entropy decoding the current coefficient based on the coding context and the encoded audio stream.

Another embodiment may have a computer program having a program code for performing one of the inventive methods, when the program code runs on a computer or a processor.

The present invention is based on the finding that in context based coding such as, for example, context based entropy coding, which can be applied to different time/frequency resolutions, a context mapping mechanism can be used, in case of time/frequency resolution changing over time, thereby achieving an improved coding efficiency. It is one finding of the present invention that when switching between different time or frequency resolutions, contexts for coefficients having the new resolutions can be derived from coefficients having the old resolutions. It is one finding of the present invention that, for example, interpolation, extrapolation, sub-sampling, down-sampling, up-sampling etc. can be used for context adaptation and/or derivation when switching time/frequency resolutions in audio coding.

Embodiments of the present invention provide a mapping method, which maps the frequency or spectral coefficients of a stored context, which refers to an old resolution, to the frequency resolution of a current context or a current frame. In other words, previous context information can be used for codebook determination, i.e. to derive new context information. Embodiments may therewith enable a more frequent switching of block length and therefore a better adaptation to signal characteristics without losing coding efficiency.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
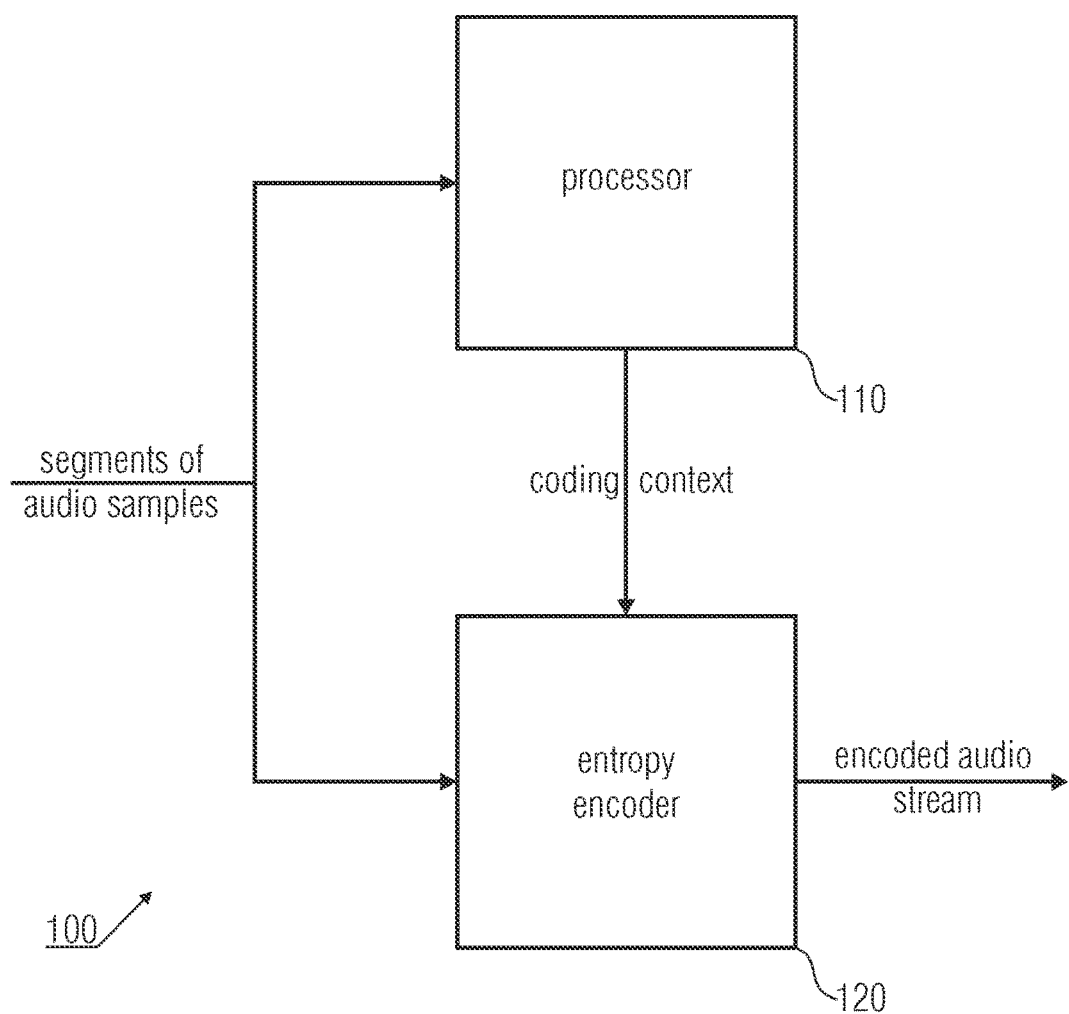
FIG. 1 shows an embodiment of an audio encoder.

FIG. 1 shows an embodiment of an audio encoder 100 for encoding segments of coefficients, the segments of coefficients representing different time or frequency resolutions of a sampled audio signal. The audio encoder 100 comprises a processor 110 for deriving a coding context for a currently encoded coefficient of a current segment based on a previously encoded coefficient of a previous segment, the previously encoded coefficient representing a different time or frequency resolution than the currently encoded coefficient. The embodiment of the audio encoder further comprises an entropy encoder 120 for entropy encoding the current coefficient based on the coding context to obtain an encoded audio stream.

In embodiments the coefficients may correspond to audio samples, quantized audio samples, spectral or frequency coefficients, scaled coefficients, transformed or filtered coefficients etc. or any combination thereof.

In embodiments the audio encoder 100 may further comprise a means for providing the segments of coefficients from an audio stream, the coefficients forming a spectral representation of an audio signal at a spectral resolution varying among the coefficients. The means for providing the segments may be adapted for determining the segments based on different time domain window lengths or different audio frames, i.e., audio frames having different lengths or different numbers of coefficients per bandwidth, i.e. a different spectral or frequency resolution. The means for providing may be adapted for determining segments of 1024 and 128 time, frequency or spectral coefficients.

The processor 110 may in embodiments be adapted for deriving the coding context based on the frequency or spectral domain representations of the current and previous coefficients or segments. In other words, in embodiments the successive segments may be represented in different time and/or frequency or spectral domains. The processor 110 may be adapted for deriving the coding context per frequency or spectral band of the current segment, e.g. based on neighbouring spectral coefficients of previous segments and/ or the current segment. In embodiments, the segments may be initially determined in the time domain, for example, by windowing an input audio stream. Based on these time domain segments or coefficients, frequency or spectral domain segments or coefficients may be determined by means of transformation. The segments may be represented in the frequency or spectral domain in terms of energy, an amplitude and phase, an amplitude and sign, etc. per frequency or spectral band, i.e., the segments may be subdivided in different frequency or spectral bands. The processor 110 may then derive coding contexts per frequency or spectral band in some embodiments.

The processor 110 and the entropy encoder 120 can be configured to operate based on a down-sampling of frequency or spectral coefficients of a previous segment when a previous segment belonging to the context comprises a finer spectral or frequency resolution than the current segment. In embodiments the processor 110 and the entropy encoder 120 can be configured to operate based on an up-sampling of frequency or spectral coefficients of a previous segment, when a previous segment of the context comprises a coarser spectral or frequency resolution than the current segment.

Embodiments may provide a method for encoding segments of coefficients representing different time or frequency resolutions of a sampled audio signal. The method may comprise a step of deriving a coding context for a currently encoded or current coefficient of a current segment based on a previously encoded or previous coefficient from a previous segment and optionally also based on the currently encoded or current coefficient, wherein the previously encoded or previous coefficient represents a different time or frequency resolution than the currently encoded or current coefficient. The method may further comprise a step of entropy encoding the current coefficient based on the coding context to obtain an encoded audio stream.

Figure 2:
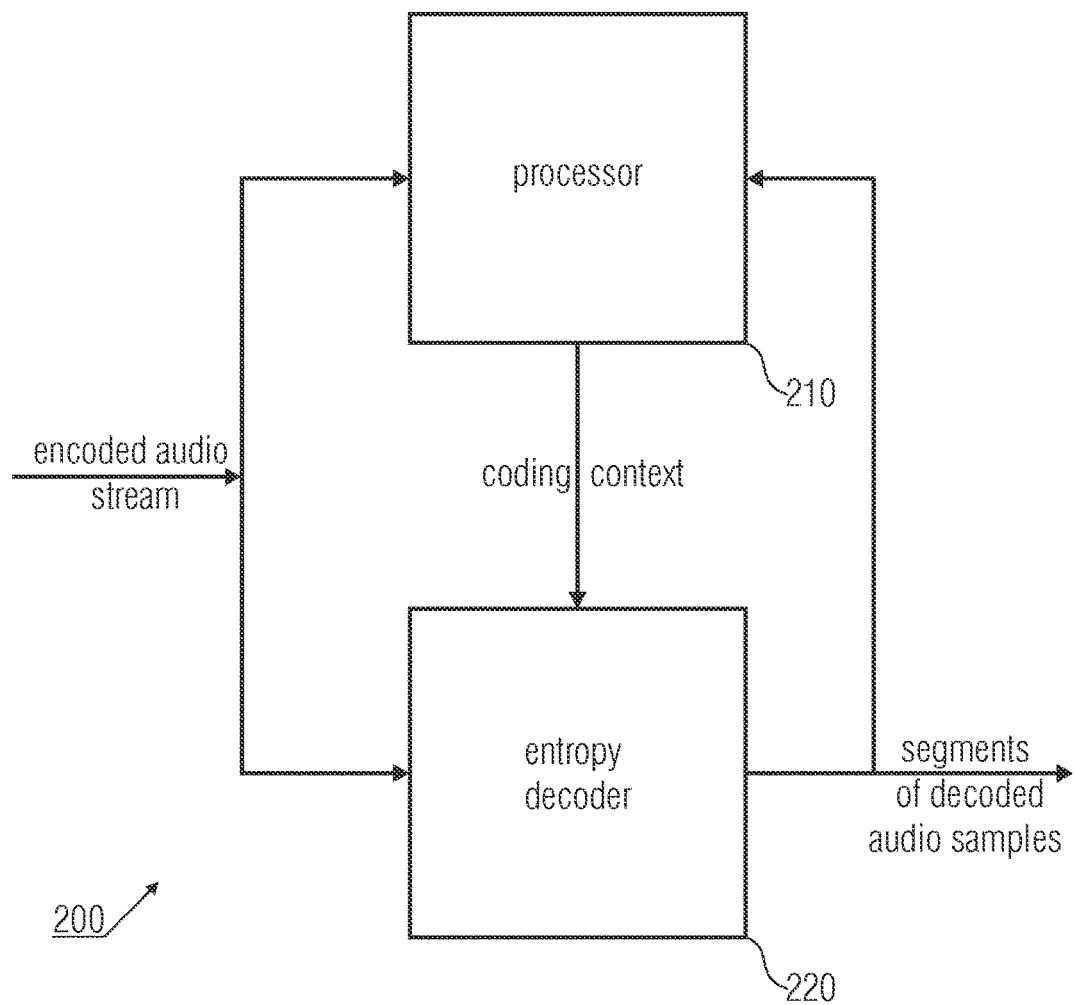
FIG. 2 shows an embodiment of an audio decoder.

Correspondingly, embodiments may comprise an audio decoder 200 of which an embodiment is depicted in FIG. 2. The audio decoder 200 is adapted for decoding an encoded audio stream to obtain segments of coefficients representing different time or frequency resolutions of a sampled audio signal, the audio decoder 200 comprises a processor 210 for deriving a coding context for a currently decoded or current coefficient based on a previously decoded or previous coefficient, the previously decoded or previous coefficient representing a different time or frequency resolution than the currently decoded coefficient. Furthermore, the audio decoder 200 comprises an entropy decoder 220 for entropy decoding the current coefficient based on the coding context and the encoded audio stream.

In embodiments, the audio decoder 200 may comprise an entropy decoder 220, which is adapted for determining the segments of decoded coefficients based on different time domain window lengths or different audio frame lengths. The entropy decoder 220 may be adapted for determining segments of, for example, 1024 and 128, time domain samples or frequency or spectral coefficients. Correspondingly, the processor 210 may be adapted for deriving the coding context based on a frequency or spectral domain representation of coefficients of previous segments and/or the current segment.

In embodiments, the processor 210 may be adapted for deriving the coding context per frequency or spectral band of the current segment, for example based on neighbouring spectral coefficients of the previous segment or segments and optionally also from the current segment. In other words, the segments may be processed in the frequency or spectral domain, which can be carried out per frequency or spectral band. Correspondingly, the processor 210 can then be adapted for deriving a frequency or spectral band specific context.

The entropy decoder 220 may be adapted for entropy decoding the current coefficient based on an entropy or variable length encoding rule.

The processor 210 may be adapted for deriving the coding context based on a down-sampling of frequency or spectral coefficients of a previous segment when the previous segment comprises more coefficients per bandwidth (i.e. a finer spectral or frequency resolution) than the current segment. In further embodiments, the processor 210 and the entropy encoder 220 may be configured to operate based on a up-sampling of spectral coefficients of a previous segment, when the previous segment comprises less coefficients per bandwidth (i.e. a coarser spectral or frequency resolution) than the current segment.

Consequently, embodiments may provide a method for decoding an encoded audio stream to obtain segments of coefficients representing decoded audio samples. The method for decoding may comprise a step of deriving a coding context for a currently decoded or current coefficient of a current segment based on a previously decoded or previous coefficient of a previous segment, the previously decoded or previous coefficient representing a different time or frequency resolution than the currently decoded coefficient. Furthermore, the method may comprise a step of entropy decoding the current coefficient based on the coding context and the encoded audio stream. Optionally, the method may comprise a step of determining the segments of encoded audio coefficients from the encoded audio stream, the segments representing different numbers of audio coefficients.

Figure 3:
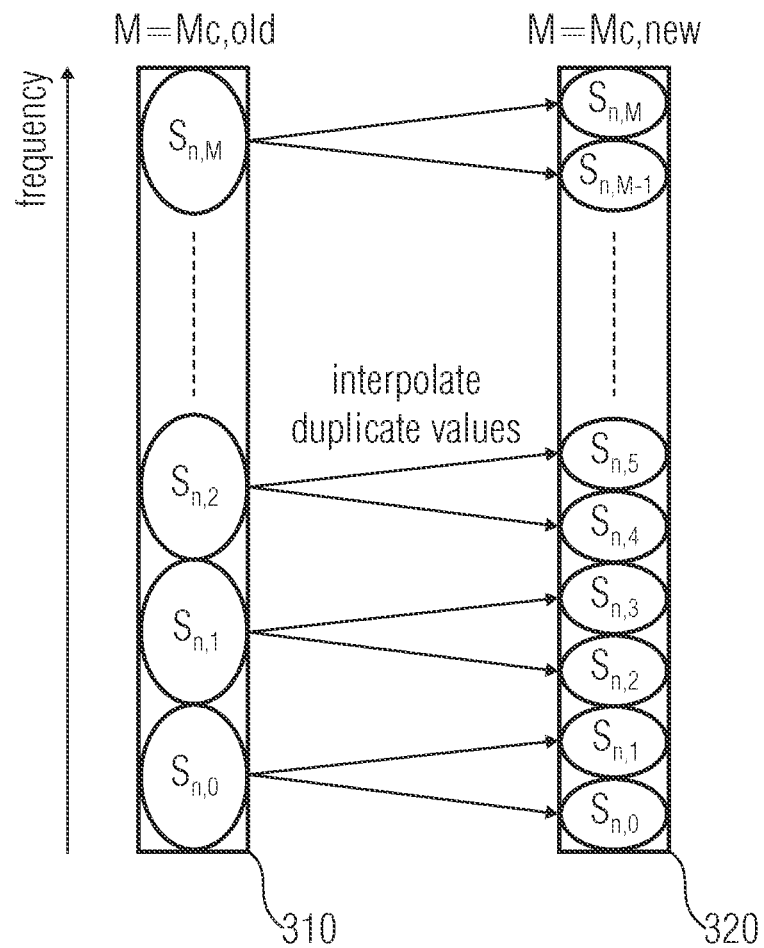
FIG. 3 shows an embodiment for a context up-sampling.

FIG. 3 illustrates how a processor 110;210 may derive a coding context for a current segment of $M_{c,new}$ coefficients based on a previous segment of $M_{c,old}$ coefficients, wherein the previous segment comprises a different number of audio coefficients than the current segment. In the embodiment depicted in FIG. 3, the number of coefficients of the segment M determines the frequency or spectral resolution of the segment. The embodiment may comprise a mapping method, which maps the $M_{c,old}$ coefficients of a previous segment to $M_{c,new}$ coefficients having the same frequency or spectral resolution of the context as the current segment. FIG. 3 shows two set of coefficients within two segments, i.e. the original previous segment 310 representing $M_{c,old}$ coefficients, $S_{n,0}$, $S_{n,1}$, $S_{n,2}$, etc., and correspondingly, the mapped previous segment 320, which has a higher resolution, i.e., $M_{c,new}$ is greater than $M_{c,old}$, representing $M_{c,new}$ coefficients, $S_{n,0}$, $S_{n,1}$, $S_{n,2}$, $S_{n,3}$, etc.

Generally, two embodiments can be distinguished, depending on whether the resolution of the context of the current segment is higher or lower than the resolution of the context of the previous segment. FIG. 3 illustrates an embodiment, in which the resolution of the previous segment of $M_{c,old}$ coefficients is lower than the resolution of the current segment of $M_{c,new}$ coefficients. FIG. 3 shows the coefficients of the previous segment 310 and the symbols for the mapped previous segment 320. From FIG. 3 can be seen that the resolution of the current segment of $M_{c,new}$ coefficients is higher than the resolution of the previous segment 310 having only $M_{c,old}$ coefficients. In one embodiment the previous segment 310 is up-sampled to a segment 320 of $M_{c,new}$ coefficients for matching the frequency or spectral resolution of the current segment. This may include pure up-sampling with symbol duplication and decimation mechanisms as for example, repeating each value $M_{c,new}$ times before decimating the resulting up-sampled segment by keeping only 1 coefficient every $M_{c,old}$. Other interpolation or extrapolation mechanisms can also be used.

In embodiments, mapping can be carried out for all previous segments 310, which are needed to determine the contexts for the current segment, e.g. at time n, in other words, multiple previous segments may be taken into account, i.e., previous segments at times n−1, n−2, etc. In general, embodiments may take multiple time slots or previous segments into account, the number of time slots needed to define a complete context may be different for different implementations or embodiments.

Figure 4:
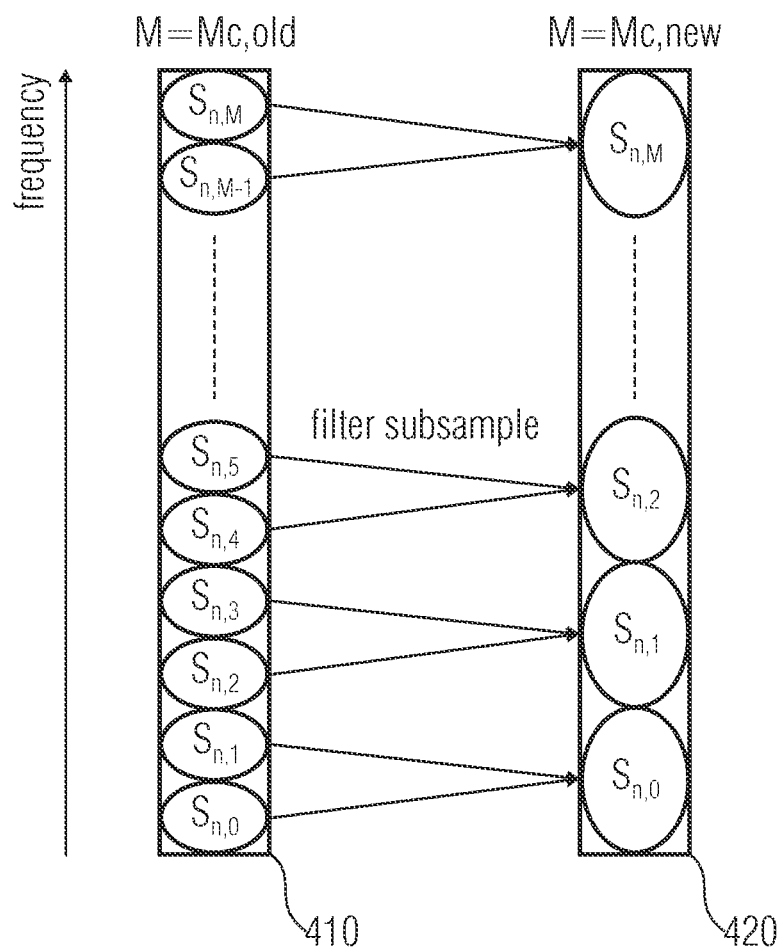
FIG. 4 shows an embodiment for a context down-sampling.

FIG. 4 illustrates another embodiment, in which coefficients of a previous segment 410 are down-sampled to a segment 420 used for computing the contexts of the current segment, i.e., in which the number of coefficients $M_{c,old}$ of the previous segment 410 is higher than the number of coefficients $M_{c,new}$ of the current segment. FIG. 4 uses a similar illustration as FIG. 3, accordingly multiple coefficients are shown in each segment 410 and 420. As illustrated in FIG. 4, $M_{c,old}$ is greater than $M_{c,new}$. Therefore, the $M_{c,old}$ coefficients are sub-sampled, to match the frequency or spectral resolution of the current segment of $M_{c,new}$ coefficients, i.e. in embodiments previous segments having a higher resolution may be sub-sampled to match the resolution of the current segment having a lower resolution. In embodiments this may include pure down-sampling with coefficient duplication and decimation mechanisms as for example, repeating each value $M_{c,new}$ times before decimating the resulting up-sampled segment by keeping only 1 coefficient every $M_{c,old}$. In other embodiments, filter operations, as for example averaging of two or multiple adjacent values may be taken into account.

Figure 5:
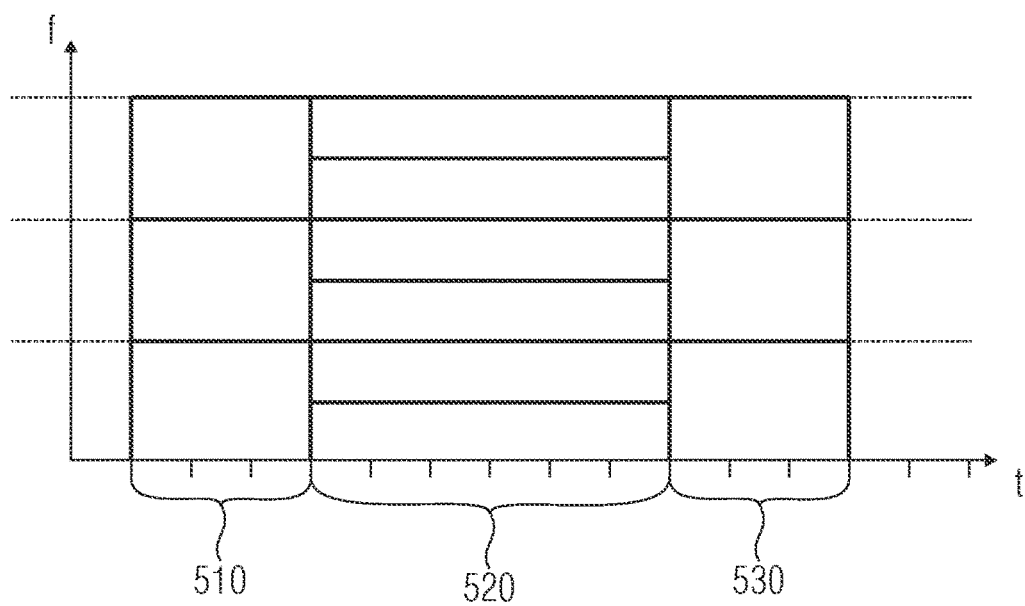
FIG. 5 illustrates audio switching time and frequency resolutions.

FIG. 5 illustrates another embodiment, in which switching between different resolutions is carried out. FIG. 5 shows a time/frequency plane, in which three subsequent segments of audio coefficients are shown, namely 510, 520 and 530. Each of the segments 510, 520 and 530 corresponds to a single set of coefficients. In the embodiment illustrated in FIG. 5, it is assumed that the second segment 520 is twice as long the first and third segments 510 and 530. This may be achieved by using different windows when segmenting in the time domain, as for example done in AAC. In the embodiment illustrated in FIG. 5, it is assumed that the sampling rate remains constant, in other words, the longer second segment 520 comprises twice as many audio coefficients per bandwidth than the first or third segment 510 or 530.

FIG. 5 shows that in this case the resolution in the frequency or spectral domain scales with the extent of the segment in the time domain. In other words, the shorter the window in the time domain, the lower the resolution in the frequency or spectral domain. When evaluating contexts for encoding the samples in the frequency or spectral domain, FIG. 5 shows that the coding needs to have a higher resolution version of the segment 510 when encoding the second segment 520 as in the example considered, a double resolution of the segment 510 has to be derived. In other embodiments, especially when using other time-frequency transformations or filterbanks, other relations between the time domain and frequency domain resolutions may result.

According to an embodiment, the coefficients encoded during the first segment 510 provides a basis for determining the context for the second segment 520, for example, by means of an intermediate up-sampling. In other words, the context content coming from the first segment 510 may be obtained by an up-sampling of the first segment 510, for example, in terms of interpolation or extrapolation, in order to derive the context for the second segment 520, having a higher resolution.

As shown in FIG. 5, when switching from the second segment 520 to the third segment 530, the context constituent element has to change as well, as the resolution has now decreased. According to an embodiment, the coefficients encoded during the second segment 520 may be used in order to derive the context for the third segment, by means of an intermediate down-sampling. This may be carried out, for example in terms of averaging or by simply using only every second value or other measures for down-sampling.

Embodiments achieve the advantage of an increased coding efficiency, by taking into account the past context derived from previous segments even when changes in the resolution or window length occur. Context constituent elements can be adapted to new resolutions, in terms of up or down-sampling, for example, with inter- or extrapolation, filtering or averaging, etc.

In the following a more specific embodiment will be presented in terms of spectral noiseless coding. Spectral noiseless coding may be used for further reducing the redundancy of a quantized spectrum in audio coding. Spectral noiseless coding can be based on an arithmetic coding in conjunction with dynamically context adaptation.

Figure 6:
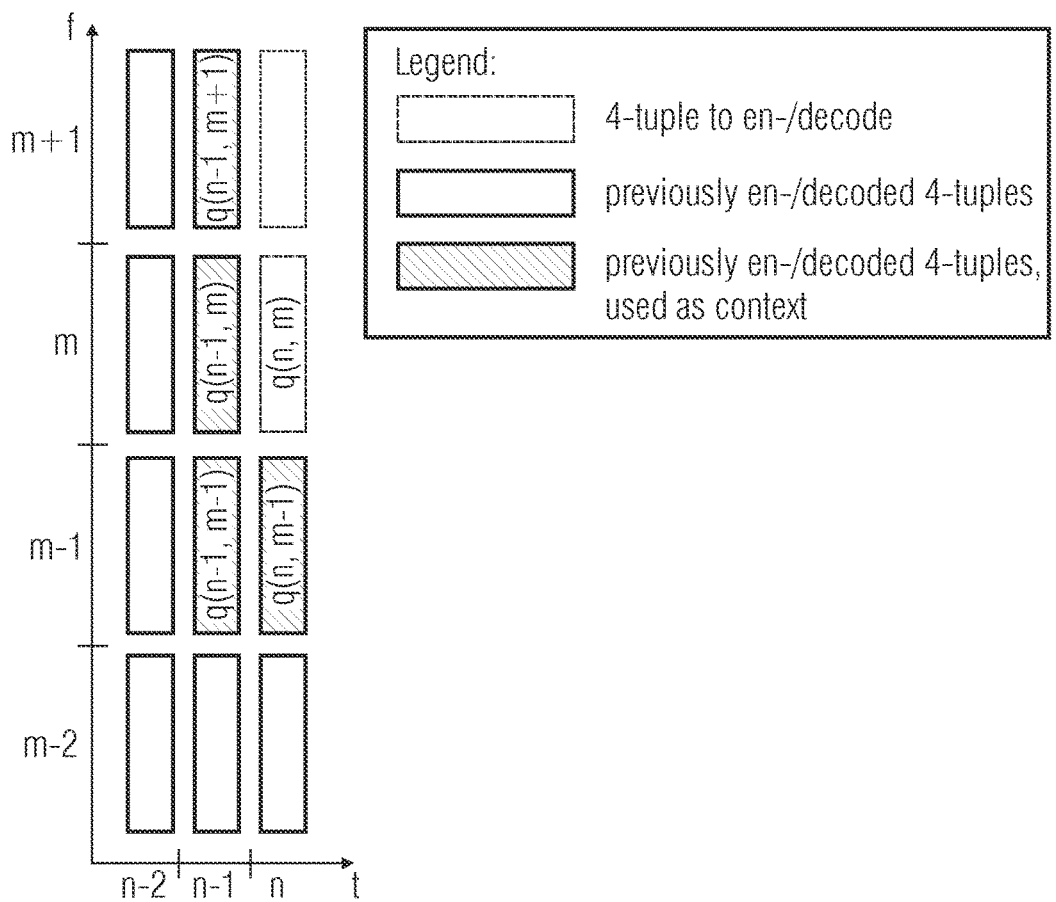
FIG. 6 illustrates an implementation of an embodiment.

Noiseless coding can be based on quantized spectral values and may use context dependent cumulative frequency tables derived from, for example, four previously decoded neighbouring tuples. FIG. 6 illustrates another embodiment. FIG. 6 shows a time frequency plane, wherein along the time axis three time slots are indexed n, n−1 and n−2. Furthermore, FIG. 6 illustrates four frequency or spectral bands which are labelled by m−2, m−1, m and m+1. FIG. 6 shows within each time-frequency slot boxes, which represent tuples of samples to be encoded or decoded. Three different types of tuples are illustrated in FIG. 6, in which boxes having a dashed or dotted border indicate remaining tuples to be encoded or decoded, white boxes having a solid border indicate previously encoded or decoded tuples and grey boxes with a solid border indicate previously en/decoded tuples, which are used to determine the context for the current tuple to be encoded or decoded.

Note that the previous and current segments referred to in the above described embodiments may correspond to a tuple in the present embodiment, in other words, the segments may be processed bandwise in the frequency or spectral domain. As illustrated in FIG. 6, tuples or segments in the neighbourhood of a current tuple (i.e. in the time and the frequency or spectral domain) may be taken into account for deriving a context. Cumulative frequency tables may then be used by the arithmetic coder to generate a variable length binary code. The arithmetic coder may produce a binary code for a given set of symbols and their respective probabilities. The binary code may be generated by mapping a probability interval, where the set of symbols lies, to a codeword. The arithmetic coder may correspond to the entropy encoder 120, respectively the entropy decoder 220 in the above described embodiments.

In the present embodiment context based arithmetic coding may be carried out on the basis of 4-tuples (i.e. on four spectral coefficient indices), which are also labelled q(n,m), representing the spectral coefficients after quantization, which are neighboured in the frequency or spectral domain and which are entropy coded in one step. According to the above description, coding may be carried out based on the coding context. As indicated in FIG. 6, additionally to the 4-tuple, which is coded (i.e. the current segment) four previously coded 4-tuples are taken into account in order to derive the context. These four 4-tuples determine the context and are previous in the frequency and/or previous in the time domain.

Figure 7A:
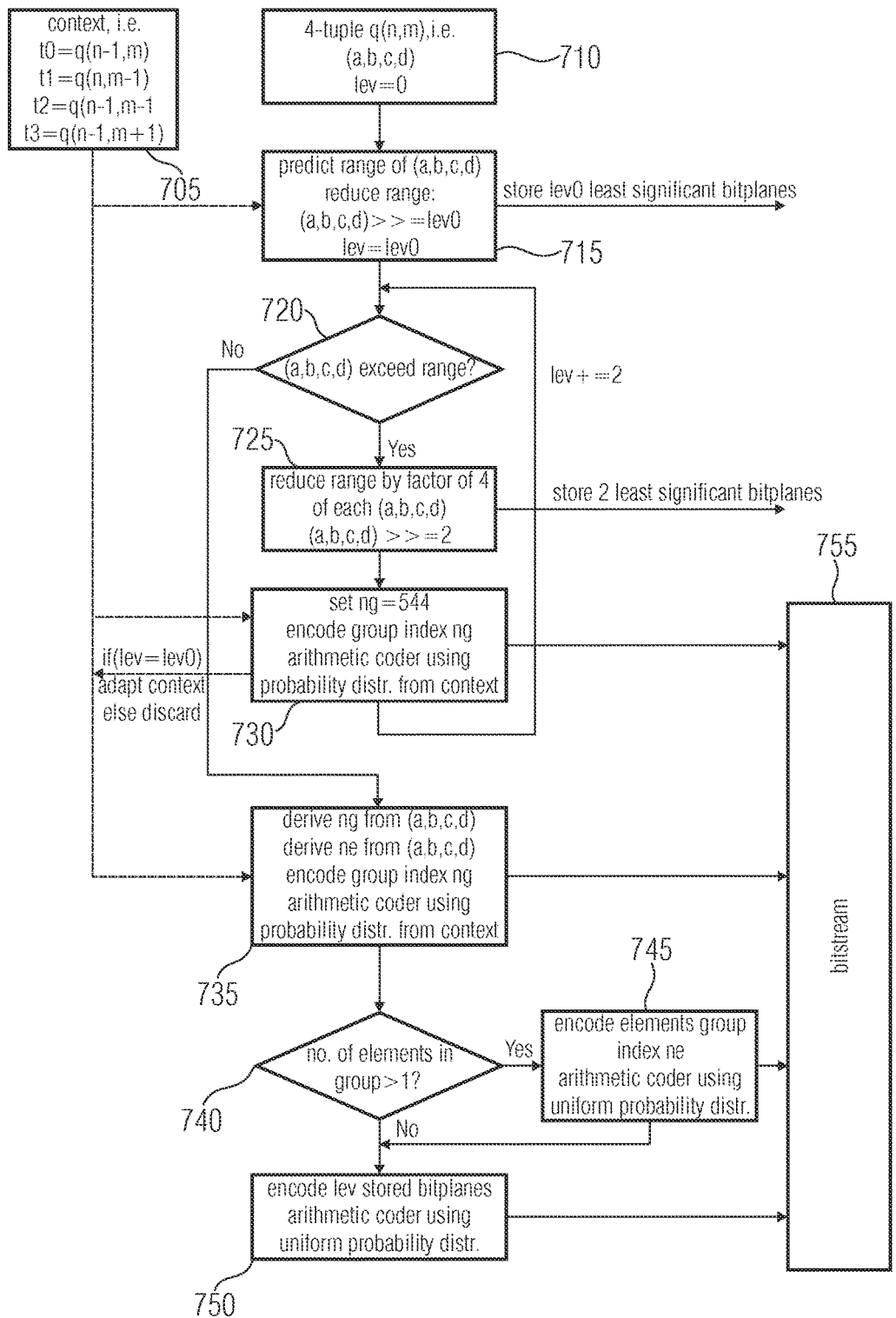
FIG. 7a shows a flowchart of an embodiment of a method for encoding.

FIG. 7a shows a flow-chart of a USAC (USAC=Universal Speech and Audio Coder) context dependent arithmetic coder for the encoding scheme of spectral coefficients. The encoding process depends on the current 4-tuple plus the context, where the context is used for selecting the probability distribution of the arithmetic coder and for predicting the amplitude of the spectral coefficients. In FIG. 7a the box 705 represents context determination, which is based on t0, t1, t2 and t3 corresponding to q(n−1, m), q(n,m−1), q(n−1,m−1) and q(n−1,m+1), that is the grey boxes with solid borders in FIG. 6.

Generally, in embodiments the entropy encoder can be adapted for encoding the current segment in units of a 4-tuple of spectral coefficients and for predicting an amplitude range of the 4-tuple based on the coding context.

In the present embodiment the encoding scheme comprises several stages. First, the literal codeword is encoded using an arithmetic coder and a specific probability distribution. The codeword represents four neighbouring spectral coefficients (a,b,c,d), however, each of a, b, c, d is limited in range:

−5<a,b,c,d<4.

Generally, in embodiments the entropy encoder 120 can be adapted for dividing the 4-tuple by a predetermined factor as often as necessitated to fit a result of the division in the predicted range or in a predetermined range and for encoding a number of divisions necessitated, a division remainder and the result of the division when the 4-tuple does not lie in the predicted range, and for encoding a division remainder and the result of the division otherwise.

In the following, if the term (a,b,c,d), i.e. any coefficient a, b, c, d, exceeds the given range in this embodiment, this can in general be considered by dividing (a,b,c,d) as often by a factor (e.g. 2 or 4) as necessitated, for fitting the resulting codeword in the given range. The division by a factor of 2 corresponds to a binary shifting to the right-hand side, i.e. (a,b,c,d)>>1.

This diminution is done in an integer representation, i.e. information may be lost. The least significant bits, which may get lost by the shifting to the right, are stored and later on coded using the arithmetic coder and a uniform probability distribution. The process of shifting to the right is carried out for all four spectral coefficients (a,b,c,d).

In general embodiments, the entropy encoder 120 can be adapted for encoding the result of the division or the 4-tuple using a group index ng, the group index ng referring to a group of one or more codewords for which a probability distribution is based on the coding context, and an element index ne in case the group comprises more than one codeword, the element index ne referring to a codeword within the group and the element index can be assumed uniformly distributed, and for encoding the number of divisions by a number of escape symbols, an escape symbol being a specific group index ng only used for indicating a division and for encoding the remainders of the divisions based on a uniform distribution using an arithmetic coding rule. The entropy encoder 120 can be adapted for encoding a sequence of symbols into the encoded audio stream using a symbol alphabet comprising the escape symbol, and group symbols corresponding to a set of available group indices, a symbol alphabet comprising the corresponding element indices, and a symbol alphabet comprising the different values of the remainders.

In the embodiment of FIG. 7a, the probability distribution for encoding the literal codeword and also an estimation of the number of range-reduction steps can be derived from the context. For example, all codewords, in a total $8^4=4096$, span in total 544 groups, which consist of one or more elements. The codeword can be represented in the bitstream as the group index ng and the group element ne. Both values can be coded using the arithmetic coder, using certain probability distributions. In one embodiment the probability distribution for ng may be derived from the context, whereas the probability distribution for ne may be assumed to be uniform. A combination of ng and ne may unambiguously identify a codeword. The remainder of the division, i.e. the bit-planes shifted out, may be assumed to be uniformly distributed as well.

In FIG. 7a, in step 710, the 4-tuple q(n,m), that is (a,b,c,d) or the current segment is provided and a parameter lev is initiated by setting it to 0.

In step 715 from the context, the range of (a,b,c,d) is estimated. According to this estimation, (a,b,c,d) may be reduced by lev0 levels, i.e. divided by a factor of $2^{lev0}$. The lev0 least significant bitplanes are stored for later usage in step 750.

In step 720 it is checked whether (a,b,c,d) exceeds the given range and if so, the range of (a,b,c,d) is reduced by a factor of 4 in step 725. In other words, in step 725 (a,b,c,d) are shifted by 2 to the right and the removed bitplanes are stored for later usage in step 750.

In order to indicate this reduction step, ng is set to 544 in step 730, i.e. ng=544 serves as an escape codeword. This codeword is then written to the bitstream in step 755, where for deriving the codeword in step 730 an arithmetic coder with a probability distribution derived from the context is used. In case this reduction step was applied the first time, i.e. if lev==lev0, the context is slightly adapted. In case the reduction step is applied more than once, the context is discarded and a default distribution is used further on. The process then continues with step 720.

If in step 720 a match for the range is detected, more specifically if (a,b,c,d) matches the range condition, (a,b,c,d) is mapped to a group ng, and, if applicable, the group element index ne. This mapping is unambiguously, that is (a,b,c,d) can be derived from ng and ne. The group index ng is then coded by the arithmetic coder, using a probability distribution arrived for the adapted/discarded context in step 735. The group index ng is then inserted into the bitstream in step 755. In a following step 740, it is checked whether the number of elements in the group is larger than 1. If necessitated, that is if the group indexed by ng consists of more than one element, the group element index ne is coded by the arithmetic coder in step 745, assuming a uniform probability distribution in the present embodiment.

Following step 745, the element group index ne is inserted into the bitstream in step 755. Finally, in step 750, all stored bitplanes are coded using the arithmetic coder, assuming a uniform probability distribution. The coded stored bitplanes are then also inserted into the bitstream in step 755.

In embodiments the entropy decoder 220 can be adapted for decoding a group index ng from the encoded audio stream based on a probability distribution derived from the coding context, wherein the group index ng represents a group of one or more codewords, and for, based on a uniform probability distribution, decoding an element index ne from the encoded audio stream if the group index ng indicates a group comprising more than one codeword, and for deriving a 4-tuple of spectral coefficients of the current segment based on the group index ng and the element index ne, thereby obtaining the spectral domain representation in tuples of spectral coefficients.

In embodiments the entropy decoder 220 can be adapted for decoding a sequence of symbols from the encoded audio stream based on the probability distribution derived from the coding context using a symbol alphabet comprising an escape symbol and group symbols corresponding to a set of available group indices ng, for deriving a preliminary 4-tuple of spectral coefficients based on an available group index ng to which a group symbol of the sequence of symbols corresponds, and based on the element index ne, and for multiplying the preliminary 4-tuple with a factor depending on a number of escape symbols in the sequence of symbols to obtain the tuple of spectral coefficients.

The entropy decoder 220 may be further adapted for decoding a remainder from the encoded audio stream based on a uniform probability distribution using an arithmetic coding rule and for adding the remainder to the multiplied preliminary 4-tuple to obtain the 4-tuple of spectral coefficients.

The entropy decoder 220 can be adapted for multiplying the 4-tuple with a predetermined factor as often as an escape symbol is decoded from the encoded audio stream, an escape symbol being a specific group index ng only used for indicating a multiplication, and for decoding a remainder from the encoded audio stream based on a uniform probability distribution using an arithmetic coding rule, the entropy decoder 220 can be further adapted for adding the remainder to the multiplied 4-tuple to obtain the current segment.

In the following an embodiment of a USAC context dependent arithmetic coder decoding scheme will be described. Corresponding to the above embodiment of the encoding scheme, 4-tuples corresponding to quantized spectral coefficients, which are noiselessly coded, are considered. Furthermore, it is assumed that the 4-tuples are transmitted starting from the lowest frequency or spectral coefficient and progressing to the highest frequency or spectral coefficient. The coefficients may, for example, correspond to AAC coefficients, which are stored in an array, and the order of transmission of the noiseless coding codewords is supposed to be such that when they are decoded in the order received and stored in the array, bin is the most rapidly incrementing index and g is the most slowly incrementing index. Within a codeword, the order of decoding is a,b,c,d.

Figure 7B:
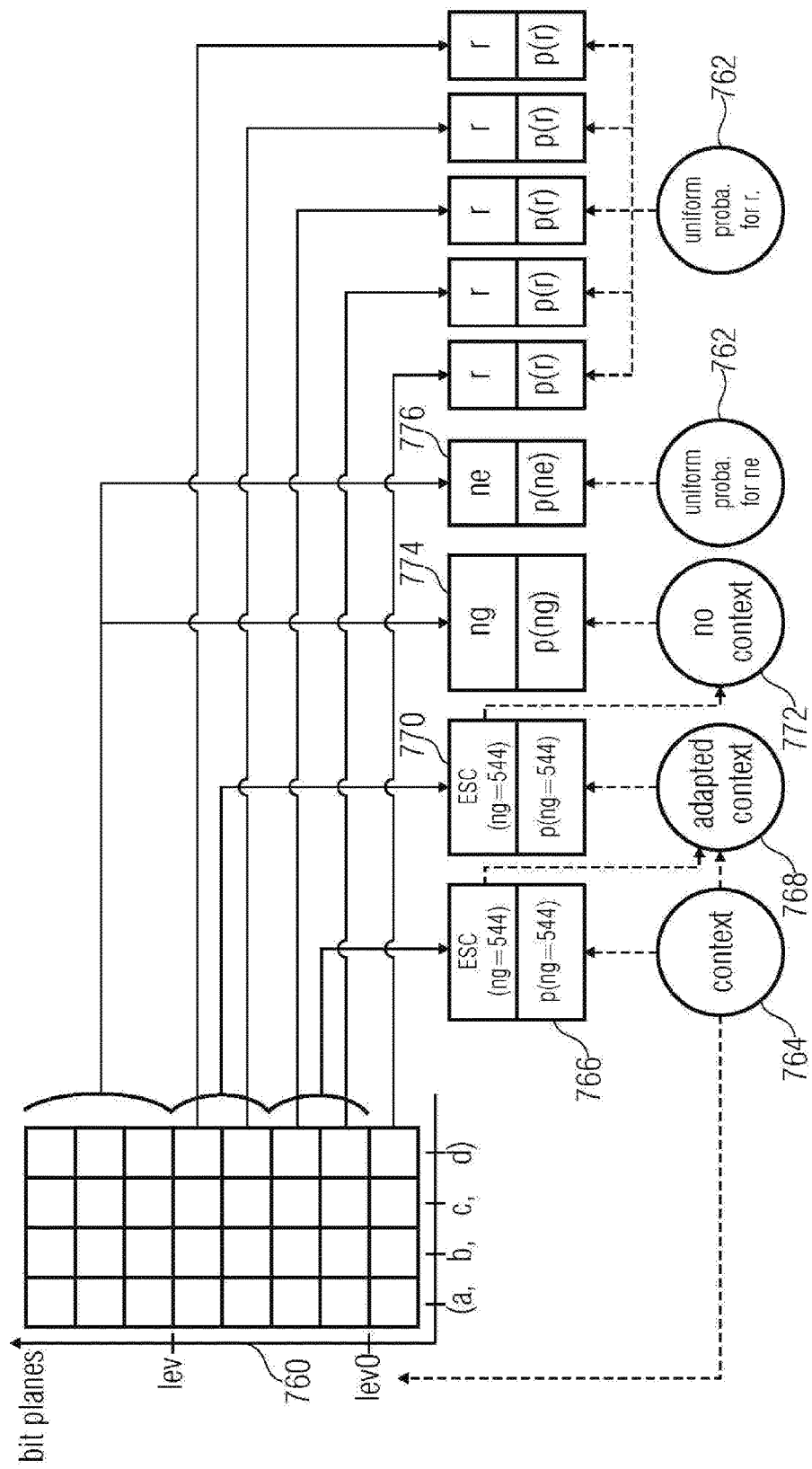
FIG. 7b illustrates the general context update procedure of an embodiment.

FIG. 7b illustrates the general context update procedure of an embodiment. Details on the context adaptation according to a bit depth prediction mechanism will be considered in the present embodiment. FIG. 7b shows a plane 760 displaying the possible range of a 4-tuple (a,b,c,d) in terms of bitplanes. The bit depth, i.e. number of bit planes needed to represent a 4-tuple, can be predicted by the context of the current 4-tuple by means of the calculation of the variable called lev0, which is also indicated in FIG. 7b. The 4-tuple is then divided by $2^{lev0}$, i.e. lev=lev0 bit planes are removed and stored for later usage according to the above-described step 715.

If the 4-tuple is in the range $-5<a,b,c,d<4$, the predicted bit depth lev0 was correctly predicted or overestimated. The 4-tuple can then be coded by the group index ng, the element index ne and the lev remaining bit planes, in line with the above description. The coding of the current 4-tuple is then finished. The coding of the element index ne is indicated in FIG. 7b by the uniform probability distribution 762, which will in the following be used for encoding element indices, where in FIG. 7b the parameter r represents the remainder of the 4-tuple after division and p(r) represents the corresponding uniform probability density function.

If the 4-tuple is not in the range −5<a,b,c,d<4 the prediction based on the coding context 764 is too low, an escape symbol (ng=544) is coded 766 and the 4-tuple is divided by 4 and lev incremented by 2, according to step 730 in FIG. 7*a*. The context is adapted as follows. If lev==lev0+2 the context is slightly adapted, corresponding to 768 in FIG. 7*b*. A flag can be set in the context representation, t, and a new probability distribution model will then be used for coding the future symbols ng.

If lev>lev0+2 another escape symbol is coded according to step 770 in FIG. 7*b* the context is completely reset, cf. 772, discarded as in step 730 in FIG. 7*a*, respectively. No context adaptation is used further because it is considered not relevant for the current 4-tuple coding. The default probability model, the one used when no context is available, is then used for the future ng symbols, which is indicated by steps 774 and 776 in FIG. 7*b*. The process is then repeated for other tuples.

To summarize, the context adaptation is a mechanism in order to reduce the context significance in the context-adaptive coding. The context adaptation can be triggered when the predicted lev0 and the actual lev mismatch. It is easily detected by the number of coded escape symbols (ng=544), cf. 766 and 770 in FIG. 7*b*, and can therefore be carried out at the decoder in a similar way as well.

The context adaptation can be done by triggering a flag in the context state representation t. The value t is calculated by the function get_state( ) as lev0, by using the context derived from the previous and/or current frame or segment of the current 4-tuple, which is stored in a table q[ ] [ ]. The state of the context can e.g. be represented by 24 bits. There are 1905800 states possible in an embodiment. These states can be represented by only 21 bits. The 23th and 24th bits of t are reserved for adapting the context state. According to the values of the 23th and the 24th bits, the get_pk( ) will output different probability distribution models. In one embodiment, the 23th bit of t may be set to one when the 4-tuple is divided by 4 after being previously divided by lev0, i.e. lev==lev0+2.

In consequence the mapping between the context state t and the probability distribution model pki, is different for lev==lev0+2 than for lev==lev0. The mapping between the context state t and the model pki is pre-defined during a training phase by performing optimizations on the overall statistics of the training sequence. When lev>lev0+2, the context and t may be set to zero. Get_pk( ) outputs then the default probability distribution model pki, which corresponds to t=0.

In the following the details of a context mapping in one embodiment will be described. The context mapping is the first operation done in context-adaptive coding after the eventual reset of the context in the present embodiment. It is done in two steps.

First, before the coding, the context table qs[ ] of size previous_lg/4, saved at the previous frame, is mapped in a context table q[0] [ ] of size lg/4 corresponding to the size of the current frame. The mapping is done in the arith_map_context function, which is exemplified by the following psuedo-code:

```
/*input variable*/
lg/4 /*number of 4-tuples*/
arith_map_context( )
```

-continued

```
{
    v=w=0
    if(core_mode==1){
        q[0][v++]=qs[w++];
    }
    ratio= ((float)previous_lg)/((float)lg);
    for(j=0; j<lg/4; j++){
        k = (int) ((float)) ((j)*ratio);
        q[0][v++] = qs[w+k];
    }
    if(core_mode==0){
        q[0] [lg/4]=qs[previous_lg/4];
    }
    q[0] [lg/4+1] =qs[previous_lg/4+1];
    previous_lg=lg;
}
```

Figure 7C:
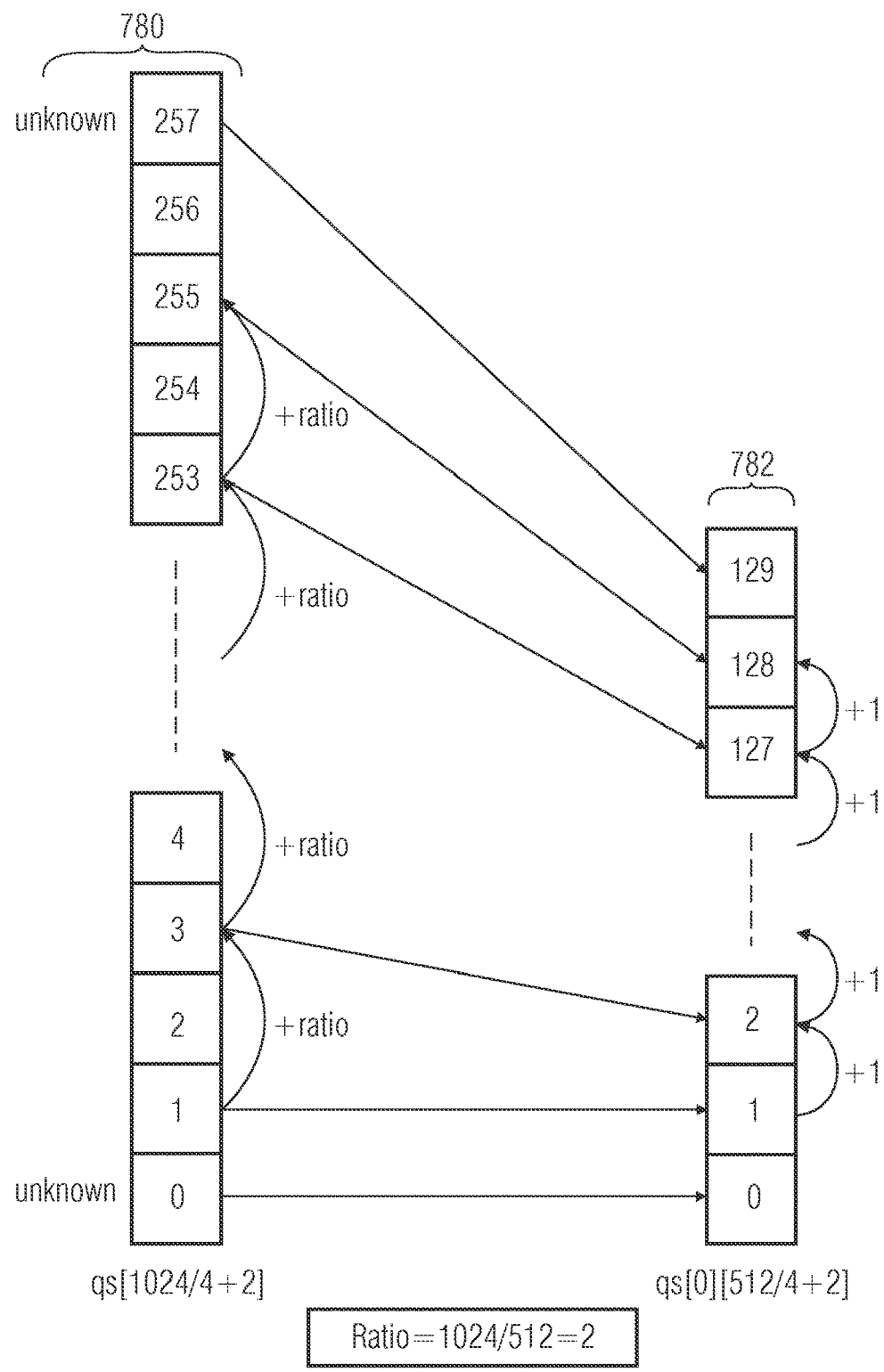
FIG. 7c illustrates the context update procedure of an embodiment for resolution changes.

As can be seen from the pseudo-code, the mapping may not be exactly the same for all coding strategies. In the present embodiment, mapping differs when AAC (Advanced Audio Coding) is used (core_mode==0) for a coefficient from when TCX (Transform based Coding) is used (core_mode==1). One of the differences comes from how the bounds of the tables are handled. In AAC, the mapping may start from index 0 (first value in the table), while for TCX it may start from the index 1 (second value in table) knowing that the first value is set to 'unknown' (specific state used to reset the context). The ratio of previous_lg over lg will determine the order of the upsampling (ratio<1) or the downsampling (ratio>1), which will be performed in present embodiment. FIG. 7*c* illustrates the case of TCX when converting from a saved context table of size 1024/4, cf. left hand side 780 of FIG. 7*c*, to a size of 512/4, cf. right hand side 782 of FIG. 7*c*. It can be seen, that while for the current context table 782 stepwise increments of 1 are used, for the saved context table 780 stepwise increments of the above described ratio are used.

FIG. 7*c* illustrates the context update procedure of an embodiment for resolution changes. Once the mapping is done, the context-adaptive coding is performed. At the end of the coding, the current frame elements are saved in table qs[ ] for the next frame. It may be done in arith_update_context( ) which is exemplified by the following pseudo-code:

```
/*input variables*/
a,b,c,d /* value of the decoded 4-tuple */
i /*the index of the 4-tuple to decode in the vector*/
lg/4 /*number of 4-tuples*/
arith_update_context ( )
{
    q[1][1+i].a=a;
    q[1][1+i].b=b;
    q[1][1+i].c=c;
    q[1][1+i].d=d;
    if ( (a<−4) || (a>=4) || (b<−4) || (b>=4) || (c<−4) || (c>=4) || (d<−4)
|| (d>=4) ) {
        q[1][1+i].v=1024;
    }
    else q[1][1+i].v=egroups[4+a][4+b][4+c][4+d];
    if(i==lg/4 && core_mode==1){
        qs[0]=q[1][0];
        ratio= ((float) lg)/((float)1024);
        for(j=0; j<256; j++){
            k = (int) ((float) j*ratio);
            qs[1+k] = q[1][1+j] ;
        }
        qs[previous_lg/4+1] = q[1][lg/4+1];
        previous_lg = 1024;
    }
```

```
    if(i==lg/4 && core_mode==0){
        for(j=0; j<258; j++){
            qs[j] = q[1][k];
        }
        previous_lg = min(1024,lg);
    }
}
```

In the present embodiment, the saving is done differently according to the core coder (AAC or TCX). In TCX the context is saved in a table qs[ ] of 1024/4 values. This additional mapping can be done because of the closed-loop decision of the AMR-WB+ (Adaptive Multirate WideBand Codec). In the close-loop decision several copy procedures of the coder states are needed for testing each possible combination of TCXs and ACELP (Arithmetic Coded Excited Linear Prediction). The state copy is easier to implement when all the TCX modes share the same size for the table qs[ ]. A mapping is then used to convert systematically from lg/4 to 1024/4. On the other hand, AAC saves only the context and performs no mapping during this phase.

Figure 8:
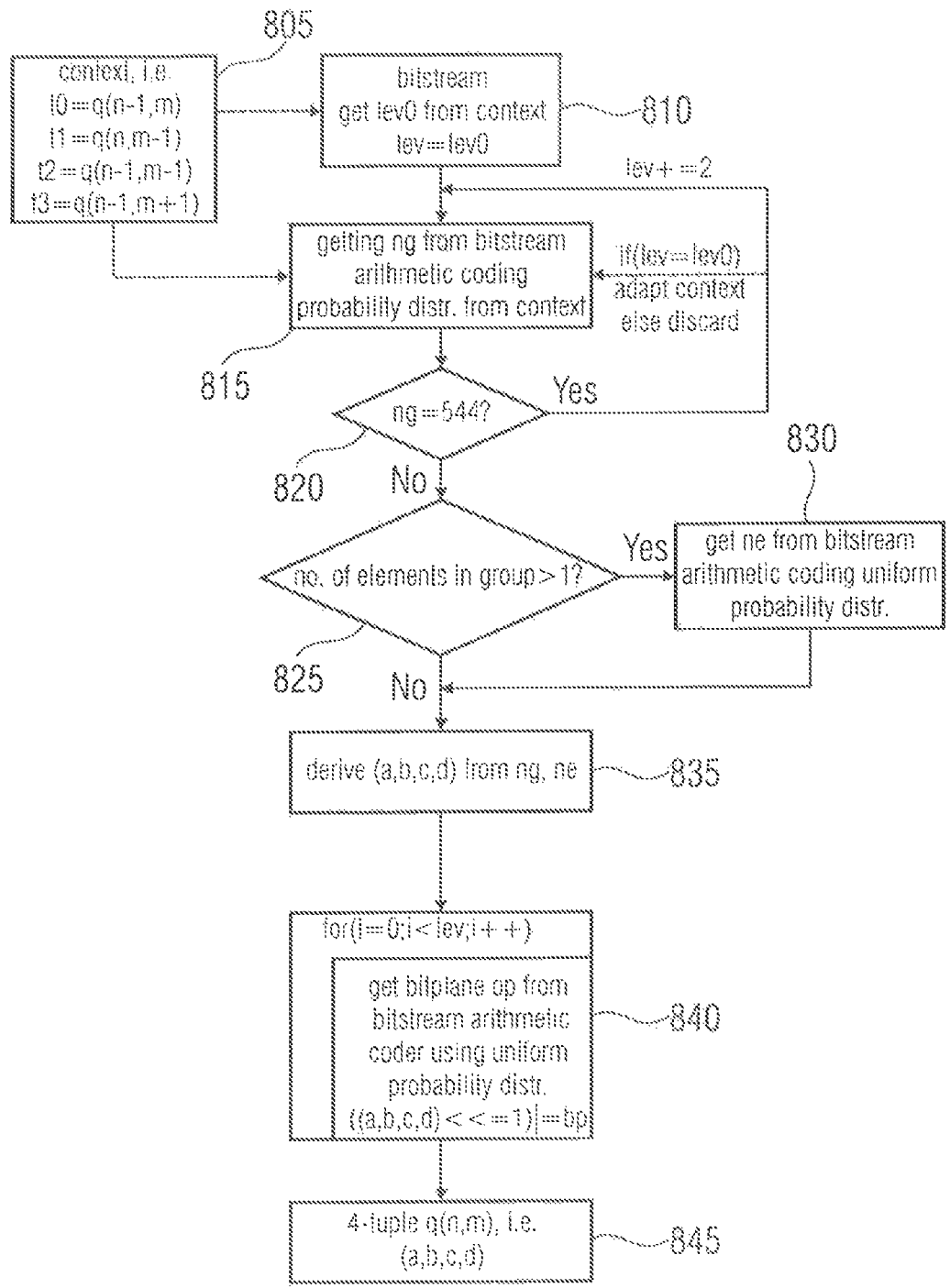
FIG. 8 shows a flowchart of an embodiment of a method for decoding.
Figure 9:
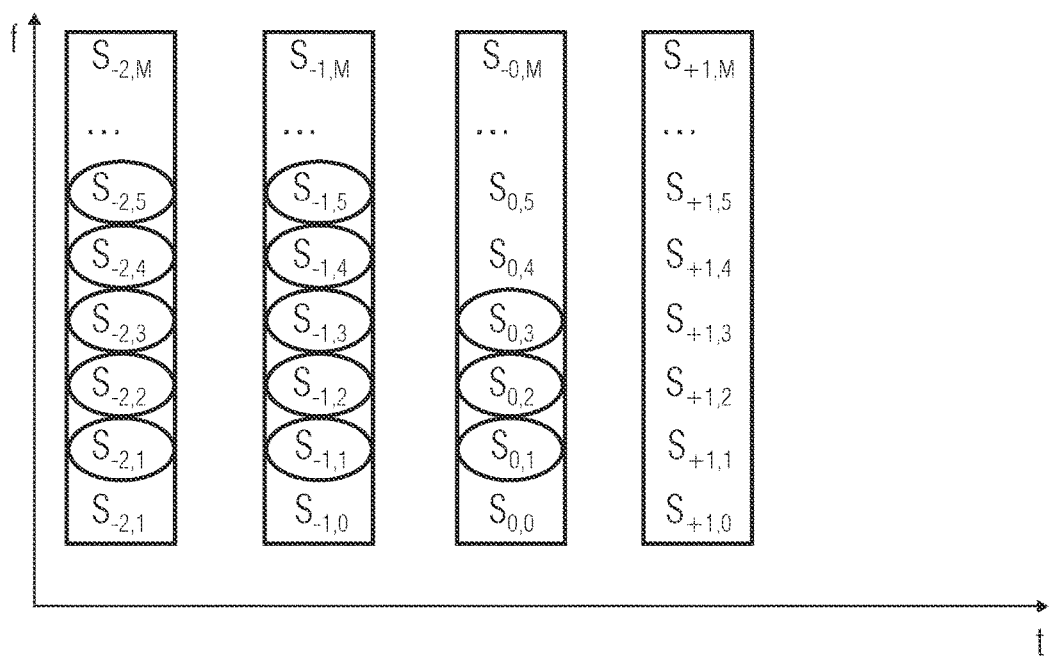
FIG. 9 shows a state-of-the-art time frequency coding scheme.

FIG. 8 illustrates a flowchart of the embodiment of the decoding scheme. In step 805, corresponding to step 705, the context is derived on the basis of t0, t1, t2 and t3. In step 810, the first reduction level lev0 is estimated from the context, and the variable lev is set to lev0. In the following step 815, the group ng is read from the bitstream and the probability distribution for decoding ng is derived from the context. In step 815, the group ng can then be decoded from the bitstream.

In step 820 it is determined whether the ng equals 544, which corresponds to the escape value. If so, the variable lev can be increased by 2 before returning to step 815. In case this branch is used for the first time, i.e., if lev==lev0, the probability distribution respectively the context can be accordingly adapted, respectively discarded if the branch is not used for the first time, in line with the above described context adaptation mechanism, cf. FIGS. 7b and 7c. In case the group index ng is not equal to 544 in step 820, in a following step 825 it is determined whether the number of elements in a group is greater than 1, and if so, in step 830, the group element ne is read and decoded from the bitstream assuming a uniform probability distribution. The element index ne is derived from the bitstream using arithmetic coding and a uniform probability distribution.

In step 835 the literal codeword (a,b,c,d) is derived from ng and ne, for example, by a look-up process in the tables, for example, refer to dgroups[ng] and acod_ne[ne].

In step 840 for all lev missing bitplanes, the planes are read from the bitstream using arithmetic coding and assuming a uniform probability distribution. The bitplanes can then be appended to (a,b,c,d) by shifting (a,b,c,d) to the left and adding the bitplane bp: ((a,b,c,d)<<=1)|=bp. This process may be repeated lev times.

Finally in step 845 the 4-tuple q(n,m), i.e. (a,b,c,d) can be provided.

In the following pseudo codes and implementation details are provide according to an embodiment. The following definitions will be used.

(a,b,c,d) 4-tuple to decode
ng Group index of the most significant 2-bits-wise plane of the 4-tuple, where 0<=ng<=544. The last value 544 corresponds to the escape symbol, ARITH_ESCAPE.
ne Element index within a group. ne lies between 0 and the cardinal of each group mm. The maximum number of elements within a group is 73.
lev Level of the remaining bit-planes. It corresponds to number the bit planes less significant than the most significant 2 bits-wise plane.
egroups [a] [b] [c] [d] Group index table. It permits to map the most significant 2 bits-wise plane of the 4-tuple (a,b,c,d) into the 544 groups.
mm Cardinal of the group
og Offset of the group
dgroups[ ] Maps the group index ng to the cardinal of each group mm (first 8 bits) and the offset of the group og in dgvectors[ ] (last 8 bits).
dgvectors[ ] Map the offset of the group og and the index of the element ne to the most significant 2 bits-wise plane of the 4-tuple (a,b,c,d).
arith_cf_ng_hash[ ] Hash table mapping the state of context to a cumulative frequencies table index pki.
arith_cf_ng[pki] [545] Models of the cumulative frequencies for the group index symbol ng.
arith_cf_ne[ ] Cumulative frequencies for element index symbol ne.
r Bit plane of the 4-tuple less significant than the most significant 2-bits wise plane.
arith_cf_r[ ] Cumulative frequencies for the least significant bit-planes symbol r In the following the decoding process is considered first. Four-tuples quantized spectral coefficients are noiselessly coded and transmitted starting from the lowest-frequency or spectral coefficient and progressing to the highest-frequency or spectral coefficient. The coefficients from AAC are stored in the array x_ac_quant[g] [win] [sfb] [bin], and the order of transmission of the noiseless coding codewords is such that when they are decoded in the order received and stored in the array, bin is the most rapidly incrementing index and g is the most slowly incrementing index. Within a codeword the order of decoding is a, b, c, d. The coefficient from the TCX are stored directly in the array x_tcx_invquant[win] [bin], and the order of the transmission of the noiseless coding codewords is such that when they are decoded in the order received and stored in the array, bin is the most rapidly incrementing index and win is the most slowly incrementing index. Within a codeword the order of decoding is a, b, c, d. First, the flag arith_reset_flag determines if the context must be reset. If the flag is TRUE the following function is called:

```
*global variables*/
q[2][290] /*current context*/
qs[258] /*past context*/
previous_lg /*number of 4-tuples of the past context*/
arith_reset_context( )
{
        for(i=0;i<258;i++){
            qs[i].a=0; qs[i].b=0; qs[i].c=0; qs[i].d=0
            qs[i].v=-1;
        }
        for(i=0;i<290;i++){
            q[0][i].a=0;      q[0][i].b=0;      q[0][i].c=0;
            q[0][i].d=0
            q[0][i].v=-1;
            q[1][i].a=0;      q[1][i].b=0;      q[1][i].c=0;
            q[1][i].d=0
            q[1][i].v=-1;
        }
        previous_lg=256;
}
```

Otherwise, when the arith_reset_flag is FALSE, a mapping is done between the past context and the current context:

```
/*input variable*/
lg /*number of 4-tuples*/
arith_map_context(lg)
{
        v=w=0
        if(core_mode==1){
                q[0] [v++]=qs[w++];
        }
        ratio= ((float)previous_lg)/((float)lg);
        for(j=0; j<lg; j++){
                k = (int) ((float)) ((j)*ratio);
                q[0][v++] = qs[w+k];
        }
        if(core_mode==0){
                q[0][lg]=qs[previous_lg];
        }
        q[0][lg+1]=qs[previous_lg+1];
        previous_lg=lg;
}
```

The noiseless decoder outputs 4-tuples of signed quantized spectral coefficients. At first the state of the context is calculated based on the four previously decoded groups surrounding the 4-tuple to decode. The state of the context is given by the function arith_get_context( ):

```
/*input variables*/
i /*the index of the 4-tuple to decode in the vector*/
arith_get_context(i,)
{
        t0=q[0][1+i].v+1;
        t1=q[1][1+i-1].v+1;
        t2=q[0][1+i-1].v+1;
        T3=q[0][1+i+1].v+1;
        if ( (t0<10) && (t1<10) && (t2<10) && (t3<10) ){
                if ( t2>1 ) t2=2;
                if ( t3>1 ) t3=2;
                return 3*(3*(3*(3*(10*(10*t0+t1))+t2)+t3)));
        }
        if ( (t0<34) && (t1<34) && (t2<34) && (t3<34) ){
                if ( (t2>1) && (t2<10) ) t2=2; else if ( t2>=10 ) t2=3;
                if ( (t3>1) && (t3<10) ) t3=2; else if ( t3>=10 ) t3=3;
                return 252000+4*(4*(34*(34*t0+t1))+t2)+t3;
        }
        if ( (t090) && (t1<90) ) return 880864+90*(90*t0+t1);
        if ( (t0<544) && (t1<544) ) return 1609864 + 544*t0+t1;
        if ( t0>1 )
        {
                a0=q[0][i].a;
                b0=q[0][i].b;
                c0=q[0][i].c;
                d0=q[0][i].d;
        }
        else a0=b0=c0=d0=0;
        if ( t1>1 )
        {
                a1=q[1][i-1].a;
                b1=q[1][i-1].b;
                c1=q[1][i-1].c;
                d1=q[1][i-1].d;
        }
        else a1=b1=c1=d1=0;
        l=0;
        do
        {
                a0>>=1;
                b0>>=1;
                c0>>=1;
                d0>>=1;
                a1>>=1;
                b1>>=1;
                c1>>=1;
                d1>>=1;
                l++;
        }
        while ( (a0<-4) || (a0>=4) || (b0<-4) || (b0>=4) || (c0<-4) ||
                (c0>=4) || (d0<-4)|| (d0>=4) ||
                (a1<-4) || (a1>=4) || (b1<-4) || (b1>=4) || (c1<-4) ||
                (c1>=4) || (d1<-4) || (d1>=4) );
        if ( t0>1 ) t0=1+(egroups[4+a0][4+b0][4+c0][4+d0] >> 16);
        if ( t1>1 ) t1=1+(egroups[4+a1][4+b1][4+c1][4+d1] >> 16);
        return 1609864 + ((l<<24)|(544*t0+t1));
}
```

Once the state is known the group to which belongs the most significant 2-bits wise plane of 4-tuple is decoded using the arith_decode( ) fed with the appropriated cumulative frequencies table corresponding to the context state. The correspondence is made by the function arith_get_pk( ):

```
/*input variable*/
s /* State of the context*/
arith_get_pk(s)
{
        psci[28] = {
                247,248,249,250,251,252,253,254,254,0,254,254,254,255,250,215,
                215,70,70,123,123,123,123,3,67,78,82,152
        };
        register unsigned char *p;
        register unsigned long i,j;
        i=123*s;
        for (;;)
        {
                j=arith_cf_nq_hash[i&32767];
                if ( j==0xFFFFFFFFul ) break;
                if ( (j>>8)==s ) return j&255;
                        i++;
        }
        p=psci+7*(s>>22);
        j= s & 4194303;
        if ( j<436961 )
        {
```

```
            if ( j<252001 ) return p[(j<243001)?0:1]; else return
        p[(j<288993)?2:3];
            }
        else
        {
            if ( j<1609865 ) return p[(j<880865)?4:5]; else return
        p[6];
        }
}
```

Then the arith_decode( ) function is called with the cumulative frequencies table corresponding to the index return by the arith_get_pk( ) The arithmetic coder is an integer implementation generating tag with scaling. The following pseudo C-code describes the used algorithm.

```
/*helper funtions*/
bool arith_first_symbol(void);
    /* Return TRUE if it is the first symbol of the sequence, FALSE
    otherwise*/
Ushort arith_get_next_bit(void);
    /* Get the next bit of the bitstream*/
/* global variables */
low
high
value
/* input variables */
cum_freq[ ] ;
cfl;
arith_decode( )
{
    if(arith_first_symbol( ))
    {
        value = 0;
        for (i=1; i<=20; i++)
        {
            value = (val<<1) | arith_get_next_bit( );
        }
        low=0;
        high=1048575;
    }
    range = high-low+1;
    cum =((((int64) (value-low+1))<<16)-((int64) 1))/((int64)
    range);
    p = cum_freq-1;
    do
    {
    q=p+(cfl>>1);
    if ( *q > cum ) { p=q; cfl++; }
    cfl>>=1;
    }
    while ( cfl>1 );
    symbol = p-cum_freq+1;
    if(symbol)
        high = low +
        (((int64)range)*((int64)cum_freq[symbol-1]))>>16 - 1;
        low += (((int64) range)* ((int64) cum_freq[symbol]))>>16;
    for (;;)
    {
    if ( high<524286) { }
        else if ( low>=524286)
        {
            value -=524286;
                low -=524286;
            high -=524286;
        }
        else if ( low>=262143 && high<786429)
        {
            value -= 262143;
            low -= 262143;
            high -= 262143;
        }
        else break;
        low += low;
        high += high+1;
```

```
        value = (value<<1) | arith_get_next_bit( );
    }
    return symbol;
}
```

While the decoded group index ng is the escape symbol, ARITH_ESCAPE, an additional group index ng is decoded and the variable lev is incremented by two. Once the decoded group index is not the escape symbol, ARITH_ESCAPE, the number of elements, mm, within the group and the group offset, og, are deduced by looking up to the table dgroups[ ]:
mm=dgroups[nq]&255
og=dgroups[nq]>>8

The element index ne is then decoded by calling arith_decode( ) with the cumulative frequencies table (arith_cf_ne+((mm*(mm-1))>>1) [ ]. Once the element index is decoded the most [ ] significant 2-bits wise plane of the 4-tuple can be derived with the table dgvector[ ]:
a=dgvectors [4*(og+ne)]
b=dgvectors [4*(og+ne)+1]
c=dgvectors [4*(og+ne)+2]
d=dgvectors [4*(og+ne)+3]

The remaining bit planes are then decoded from the most significant to the lowest significant level by calling lev times arith_decode( ) with the cumulative frequencies table arith_cf_r[ ]. The decoded bit plane r permits to refine the decode 4-tuple by the following way:
a=(a<<1)|(r&1)
b=(b<<1)|((r>>1)&1)
c=(c<<1)|((r>>2)&1)
d=(d<<1)|(r>>3)

Once the 4-tuple (a,b,c,d) is completely decoded the context tables q and qs are updated by calling the function arith_update_context( ).
arith_update_context(a,b,c,d,i,lg)

```
{
    q[1][1+i].a=a;
    q[1][1+i].b=b;
    q[1][1+i].c=c;
    q[1][1+i].d=d;
    if ( (a<-4) || (a>=4) || (b<-4) || (b>=4) || (c<-4) || (c>=4)
|| (d<-4) || (d>=4) )
        q[1][1+i].v =1024;
    else q[1][1+i].v=egroups[4+a][4+b][4+c][4+d];
    if(i==lg && core_mode==1){
        qs[0]=q[1] [0];
        ratio= ((float) lg)/((float)256);
        for(j=0; j<256; j++){
            k = (int) ((float)) ((j)*ratio);
            qs[1+k] = q[1][1+j] ;
        }
        qs[previous_lg+1]=q[1][lg+1];
        previous_lg=256;
```

```
        }
    if(i==lg && core_mode==0){
        for(j=0; j<258; j++){
            qs[j] = q[1][k];
        }
        previous_lg=min(1024,lg);
    }
}
```

Depending on certain implementation requirements of the inventive methods, the inventive methods may be implemented in hardware or in software. The implementation can be formed using a digital storage medium, in particular, a disk, a DVD, or a CD, having an electronically readable control signal stored thereon, which cooperates with the programmable computer, such that the inventive methods are performed. Generally, the present invention is therefore a computer program product with a program code for a machine-readable carrier, the program code being operative for performing the inventive methods when the computer program runs on a computer. In other words, the inventive methods are, therefore, a computer program having a program code for performing at least one of the inventive methods when the computer program runs on a computer.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. An audio encoding apparatus for encoding segments of coefficients, the segments of coefficients representing different time or frequency resolutions of a sampled audio signal, the audio encoding apparatus comprising
a provider for providing the segments of coefficients from an audio stream, the coefficients forming a spectral representation of an audio signal represented by the audio stream at a spectral resolution varying among the segments;
a processor for deriving an entropy coding context for a currently encoded coefficient of a current segment based on a previously encoded coefficient of a previous segment, the previously encoded coefficient representing a different time or frequency resolution than the currently encoded coefficient; and
an entropy encoder for entropy encoding the current coefficient based on the entropy coding context to acquire an encoded audio stream,
wherein the entropy encoder is adapted for encoding the current coefficient in units of a tuple of spectral coefficients and for predicting a range of the tuple based on the entropy coding context,
wherein the entropy encoder is adapted for dividing the tuple by a predetermined factor as often as necessitated to fit a result of the division in a predetermined range and for encoding a number of divisions necessitated, a division remainder and the result of the division when the tuple does not lie in the predicted range, and for encoding a division remainder and the result of the division otherwise, and
wherein the entropy encoder is adapted for encoding the result of the division or the tuple using a group index, the group index referring to a group of one or more codewords for which a probability distribution is based on the entropy coding context, and, based on a uniform probability distribution, an element index in case the group comprises more than one codeword, the element index referring to a codeword within the group, and for encoding the number of divisions by a number of escape symbols, an escape symbol being a specific group index only used for indicating a division, and for encoding the remainders of the divisions based on a uniform probability distribution using an arithmetic coding rule.

2. An audio decoding apparatus for decoding an encoded audio stream to acquire segments of coefficients representing different time or frequency resolutions of a sampled audio signal, comprising
a processor for deriving an entropy coding context for a currently decoded coefficient of a current segment based on a previously decoded coefficient of a previous segment, the previously decoded coefficient representing a different time or frequency resolution than the currently decoded coefficient; and
an entropy decoder for entropy decoding the current coefficient based on the entropy coding context and the encoded audio stream,
wherein the processor is adapted for deriving the entropy coding context based on the previous coefficient, the coefficients forming a spectral representation of an audio signal represented by the audio stream at a spectral resolution varying among the segments,
wherein the processor is adapted for deriving the entropy coding context for the current coefficient, based on neighbouring spectral coefficients previously decoded in one or more of the previous segment and the present segment, and
wherein the entropy decoder is adapted for decoding a group index from the encoded audio stream based on a probability distribution derived from the entropy coding context, wherein the group index represents a group of one or more codewords, and for, based on a uniform probability distribution, decoding an element index from the encoded audio stream if the group index indicates a group comprising more than one codeword, and for deriving a tuple of spectral coefficients of the current segment based on the group index and the element index, thereby acquiring the spectral domain representation in tuples of spectral coefficients.

* * * * *